United States Patent
Jeon et al.

(10) Patent No.: US 9,806,277 B2
(45) Date of Patent: Oct. 31, 2017

(54) ORGANIC LIGHT EMITTING DISPLAY APPARATUS AND METHOD OF MANUFACTURING SAME

(71) Applicant: SAMSUNG DISPLAY CO., LTD., Yongin-si, Gyeonggi-Do (KR)

(72) Inventors: Woosik Jeon, Hwaseong-si (KR); Okkeun Song, Hwaseong-si (KR); Sungsoo Lee, Suwon-si (KR); Yonghan Lee, Seongnam-si (KR)

(73) Assignee: Samsung Display Co., Ltd., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/956,422

(22) Filed: Dec. 2, 2015

(65) Prior Publication Data

US 2016/0285029 A1     Sep. 29, 2016

(30) Foreign Application Priority Data

Mar. 26, 2015   (KR) .................. 10-2015-0042381

(51) Int. Cl.
  *H01L 51/00*   (2006.01)
  *H01L 51/52*   (2006.01)
  *H01L 51/56*   (2006.01)

(52) U.S. Cl.
  CPC ........ *H01L 51/5203* (2013.01); *H01L 51/005* (2013.01); *H01L 51/0052* (2013.01); *H01L 51/0054* (2013.01); *H01L 51/0055* (2013.01); *H01L 51/0067* (2013.01); *H01L 51/0072* (2013.01); *H01L 51/5237* (2013.01); *H01L 51/56* (2013.01)

(58) Field of Classification Search
  CPC ............... H01L 51/005; H01L 51/0052; H01L 51/0054; H01L 51/0055
  See application file for complete search history.

(56) References Cited

U.S. PATENT DOCUMENTS

| | | | | |
|---|---|---|---|---|
| 2005/0205863 A1* | 9/2005 | Choi | ...................... | B82Y 10/00 257/40 |
| 2008/0122347 A1* | 5/2008 | Lee | ...................... | H01L 27/3244 313/504 |
| 2014/0293162 A1* | 10/2014 | Park | .................. | G02F 1/133502 349/12 |

(Continued)

FOREIGN PATENT DOCUMENTS

| | | |
|---|---|---|
| JP | 2014-175262 A | 9/2014 |
| KR | 10-2003-0026450 A | 4/2003 |
| KR | 10-2004-0085010 A | 10/2004 |

(Continued)

*Primary Examiner* — Douglas Menz
(74) *Attorney, Agent, or Firm* — Lee & Morse, P.C.

(57) ABSTRACT

An organic light emitting display apparatus includes a substrate, an organic layer on the substrate, wherein the organic layer includes a first concave portion and a first convex portion on a surface thereof, a first electrode on the organic layer, wherein the first electrode includes a second concave portion and a second convex portion on a surface thereof, a second electrode on the first electrode, and an emission layer between the first and second electrodes. A vertical distance between the second concave portion and the second convex portion is less than that between the first concave portion and the first convex portion.

18 Claims, 5 Drawing Sheets

(56) References Cited

U.S. PATENT DOCUMENTS

2017/0062769 A1*  3/2017  Kim .................... H01L 27/3246

FOREIGN PATENT DOCUMENTS

| KR | 10-2008-0047725 A | 5/2008 |
| KR | 10-2011-0137087 A | 12/2011 |
| KR | 10-1239904 B1 | 3/2013 |
| KR | 10-2015-0069871 A | 6/2015 |

* cited by examiner

ORGANIC LIGHT EMITTING DISPLAY APPARATUS AND METHOD OF MANUFACTURING SAME

CROSS-REFERENCE TO RELATED APPLICATION

Korean Patent Application No. 10-2015-0042381, filed on Mar. 26, 2015, in the Korean Intellectual Property Office, and entitled: "Organic Light Emitting Display Apparatus and Method of Manufacturing Same," is incorporated by reference herein in its entirety.

BACKGROUND

1. Field

Embodiments relate to an organic light emitting display apparatus and a method of manufacturing the same.

2. Description of the Related Art

An organic light emitting display apparatus does not require a separate light source due to a self-luminous characteristic thereof. Accordingly, an organic light emitting display apparatus has advantages of miniaturization and lightweight. In addition, the organic light emitting display apparatus has characteristics of low power consumption, high luminance, and high response speed, and the like, which make it attractive as a next generation display apparatus.

The organic light emitting display apparatus includes an anode electrode, an organic emission layer, and a cathode electrode. A hole injected from an anode electrode and an electron injected from a cathode electrode are combined in the organic emission layer to form an exciton. The organic light emitting display apparatus emits light by energy generated when the exciton falls from an excited state to a ground state.

SUMMARY

Embodiments are directed to an organic light emitting display apparatus including a substrate, an organic layer on the substrate, wherein the organic layer includes a first concave portion and a first convex portion on a surface thereof, a first electrode on the organic layer, wherein the first electrode includes a second concave portion and a second convex portion on a surface thereof, a second electrode on the first electrode, and an emission layer between the first and second electrodes. A vertical distance between the second concave portion and the second convex portion is less than that between the first concave portion and the first convex portion.

The organic layer may include at least one base material selected from the group of benzene, naphthalene, anthracene, tetracene, pentacene, amine, benzidine, biphenyl, carbazole, pyridine, pyridine, bipyridine, imidazole, phenanthroline, phenylborane, pyrimidine, and triazine. The base material may be substituted by at least one substituent selected from the group of a benzoyl group, a carboxyl group, an aminophenoxyl group, a tricarbonate group, and a styryl group.

The base material may include a plurality of substitution sites substituted by the substituent.

The organic light emitting display apparatus may further include a hole transport region between the first electrode and the emission layer and an electron transport region between the second electrode and the emission layer.

The hole transport region may include a hole injection layer on the first electrode and a hole transport layer on the hole injection layer.

The electron transport region may include at least two selected from the group of a hole blocking layer, an electron transport layer, and an electron injection layer on the emission layer.

The organic light emitting display apparatus may further include an encapsulation layer on the second electrode, the encapsulation layer sealing the organic layer, the first electrode, the hole transport region, the emission layer, the electron transport region, and the second electrode from an outside.

Each of the second electrode, the emission layer, the hole transport region, the electron transport region, and the encapsulation layer may include a concave portion and a convex portion on a surface thereof.

A vertical distance between a concave portion and the convex portion of each of the second electrode, the emission layer, the hole transport region, the electron transport region, and the encapsulation layer may be the same as or less than that between the second concave portion and the second convex portion.

The first electrode may be thinner than the second electrode.

Embodiments are also directed to a method of manufacturing an organic light emitting display apparatus, including providing a substrate, forming an organic layer having a first concave portion and a first convex portion on a surface of the substrate, forming a first electrode having a second concave portion and a second convex portion on a surface of the organic layer, forming a hole transport region on the first electrode, forming an emission layer on the hole transport region, forming an electron transport region on the emission layer, and forming a second electrode on the electron transport region. In forming the first electrode having the second concave portion and the second convex portion on the surface of the organic layer, a vertical distance between the second concave portion and the second convex portion is formed to be less a vertical distance that between the first concave portion and the first convex portion.

The organic layer may include at least one base material selected from the group of benzene, naphthalene, anthracene, tetracene, pentacene, amine, benzidine, biphenyl, carbazole, pyridine, pyridine, bipyridine, imidazole, phenanthroline, phenylborane, pyrimidine, and triazine. The base material may be substituted by at least one substituent selected from the group of a benzoyl group, a carboxyl group, an aminophenoxyl group, a tricarbonate group, and a styryl group.

The base material may include a plurality of substitution sites substituted by the substituent.

Forming the organic layer may be performed by a thermal deposition process or an electron beam deposition process.

Forming the organic layer having the first concave portion and the first convex portion on the surface of the substrate, forming the first electrode having the second concave portion and the second convex portion on the surface of the organic layer, forming the hole transport region on the first electrode, forming the emission layer on the hole transport region, forming the electron transport region on the emission layer, and forming the second electrode on the electron transport region, may be performed by a same method of deposition.

Forming the hole transport region may include forming a hole injection layer on the first electrode and forming a hole transport layer on the hole injection layer.

Forming the electron transport region may include at least two selected from the group of forming a hole blocking layer on the emission layer, forming an electron transport layer on the hole blocking layer, and forming an electron injection layer on the electron transport layer.

Each of the first and second electrodes, the emission layer, the hole transport region, and the electron transport region may be formed to include a concave portion and a convex portion on a surface thereof.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
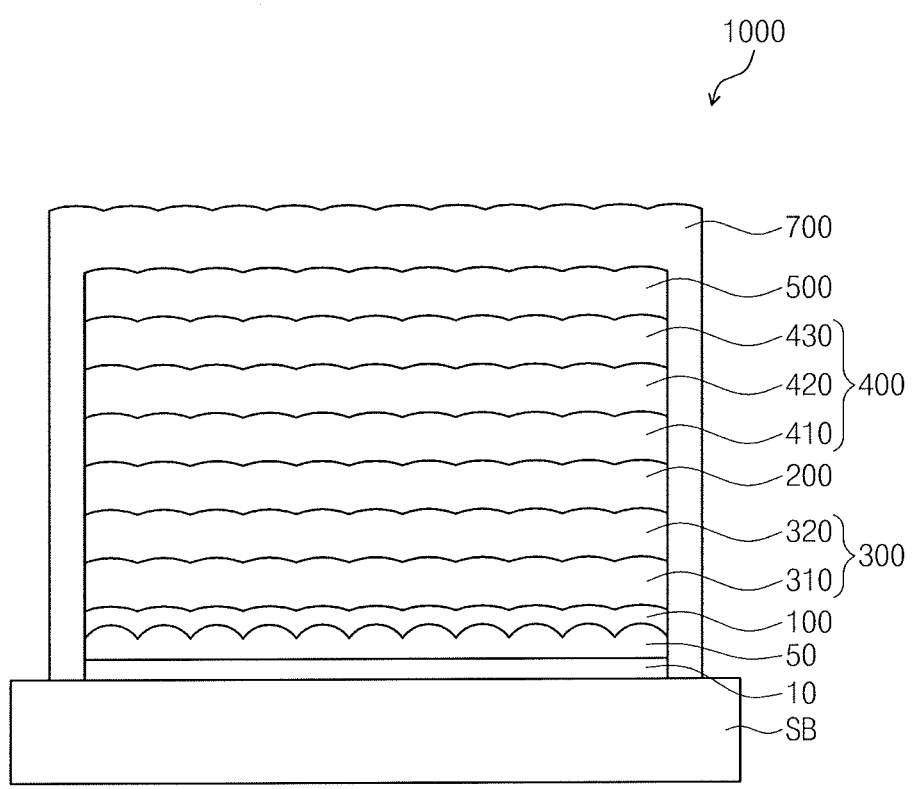
FIG. 1 schematically illustrates a cross-sectional view of an organic light emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Throughout the specification, when it is said that a part "includes" or "has" designate specific feature, other features are not precluded.

Figure 2:
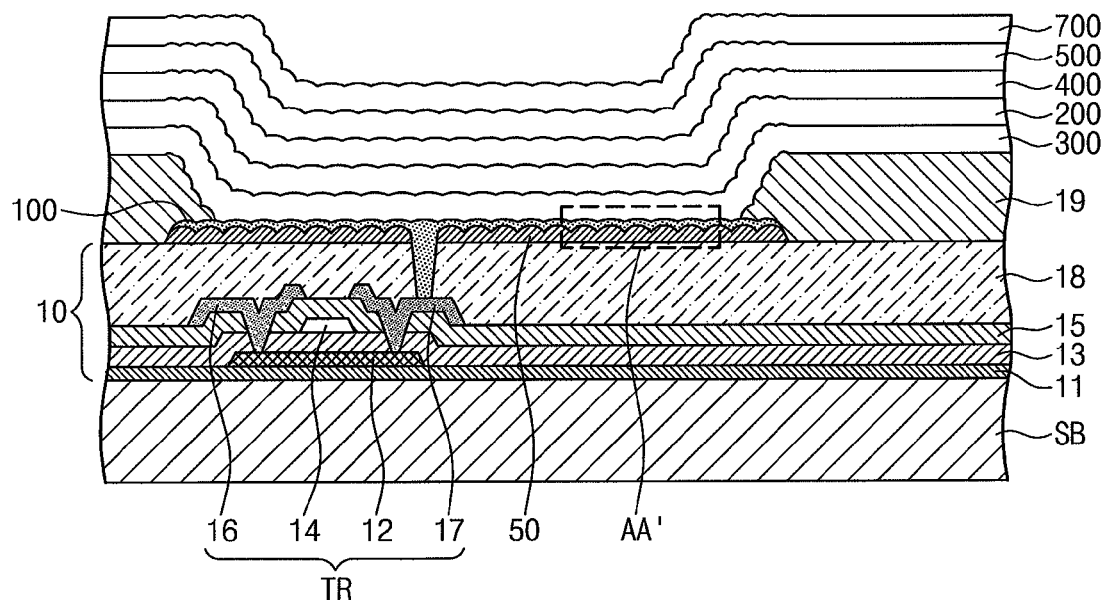
FIG. 2 illustrates a cross-sectional view of one pixel of an organic light emitting display apparatus of FIG. 1.

FIG. 1 schematically illustrates a cross-sectional view of an organic light emitting display apparatus according to an embodiment, and FIG. 2 illustrates a cross-sectional view of one pixel of an organic light emitting display apparatus of FIG. 1.

The organic light emitting display apparatus 1000 may include a driver layer 10, an organic layer 50, a first electrode 100, a hole transport region 300, an emission layer 200, an electron transport region 400, a second electrode 500, and an encapsulation layer 700, which are disposed on a substrate SB.

The driver layer 10 may be a layer in which a thin film transistor TR is formed.

The driver layer 10 may be formed of a plurality of layers on the substrate SB. The driver layer 10 may include a buffer film 11 formed on the substrate SB, and a thin film transistor TR formed on the buffer film 11. In FIG. 2, only one thin film transistor TR is illustrated. In some implementations, a plurality of thin film transistors may be provided in one pixel.

The buffer film 11 may prevent an impurity element from penetrating through the substrate SB and may provide a flat surface to the substrate SB. The buffer film 11 may contain, for example, an inorganic material such as silicon oxide, silicon nitride, silicon oxynitride, aluminum oxide, aluminum nitride, titanium oxide, titanium nitride, or an organic material such as polyimide, polyester, or acrylic. The buffer film 11 may be formed as a stack structure including a plurality of layers formed of the above-exemplified materials. In some implementations, the buffer film 11 may be omitted.

A semiconductor active layer 12 may be formed on the buffer layer 11. The semiconductor active layer 12 may be formed of a polycrystalline silicon. In some implementations, the semiconductor active layer 12 may be formed of an oxide semiconductor. For example, the semiconductor active layer 12 may be a G-I—Z—O layer $[(In_2O_3)a(Ga_2O_3)b(ZnO)c$ layer] (where a, b, and c are real numbers satisfying the conditions of $a≥0$, $b≥0$, and $c>0$).

A gate insulating film 13 may be formed on the semiconductor active layer 12 and the buffer film 11, and a gate electrode 14 may be formed on the gate insulating film 13.

An interlayer insulating film 15 may be formed on the gate electrode 14 and the gate insulating film 13, and a source electrode 16 and a drain electrode 17 may be formed on the interlayer insulating film 15 such that each of the interlayer insulating film 15, the source electrode 16, and the drain electrode 17 is electrically connected to the semiconductor active layer 12.

The thin film transistor TR may have a suitable structure. For example, the thin film transistor TR is formed in a top-gate structure. In some implementations, the thin film transistor TR may be formed in a bottom-gate structure in which the gate electrode 14 is disposed under the semiconductor active layer 12.

A passivation film 18 may be formed on the source electrode 16, the drain electrode 17, and the interlayer insulating film 15. The passivation film 18 may be a single or multi-layered insulating film having a planarized upper surface. The passivation film 18 may be formed of an inorganic and/or organic material.

The organic layer 50 may be formed on the passivation film 18. The organic layer 50 may be in the form of islands independent from each other for each pixel. In the organic layer 50, a concave portion and a convex portion (hereinafter, referred to as "an unevenness") formed during a process in which materials constituting the organic layer 50 are deposited on the passivation film 18 may be provided to the surface of the organic layer 50.

The organic layer 50 according to an embodiment may include at least one base material selected from the group consisting of benzene, naphthalene, anthracene, tetracene, pentacene, amine, benzidine, biphenyl, carbazole, pyridine, pyridine, bipyridine, imidazole, phenanthroline, phenylborane, pyrimidine, or triazine.

The base material may be substituted by at least one substituent selected from the group of a benzoyl group, a carboxyl group, an aminophenoxyl group, a tricarbonate group, or a styryl group. The base material may include a plurality of substitution sites substituted by the substituent.

The molecular structure of the base material may have a planar shape or a shape equivalent to the planar shape. Accordingly, the base material may have a structure in which a layer may be easily stacked on another layer. In addition, the molecular structure of the substituent has a curved shape. Accordingly, the substituent may have a structure that is easy to agglomerate.

The first electrode 100 may be disposed on the organic layer 50 and electrically connected to the thin film transistor TR. The first electrode 100 may be in the form of islands independent from each other for each pixel.

In the first electrode 100, an unevenness formed during a process in which materials constituting the first electrode 100 are deposited on the organic layer 50 may be provided to the surface of the first electrode 100.

The first electrode 100 may be a pixel electrode, for example, an anode. The first electrode 100 may receive a signal applied to the source electrode 16 through the drain electrode 17 in response to a gate signal applied to the gate electrode 14.

The first electrode 100 may be a transmissive electrode, a semi-transmissive electrode, or a reflective electrode. When the first electrode 100 is a transmissive electrode, the first electrode 100 may be formed of a transparent metal oxide, for example, indium tin oxide ITO, indium zinc oxide IZO, zinc oxide ZnO, indium tin zinc oxide ITZO, or the like. When the first electrode 100 is a semi-transmissive electrode or a reflective electrode, the first electrode 100 may include Ag, Mg, Al, Pt, Pd, Au, Ni, Nd, Ir, Cr, or a mixture thereof.

The first electrode 100 may be a single-layer or a multi-layer formed of a transparent metal oxide or a metal. For example, the first electrode 100 may have a single-layer structure of ITO, Ag, or a metal mixture (e.g., a mixture of Ag and Mg), a two-layer structure of ITO/Mg or ITO/MgF, or a three-layer structure of ITO/Ag/ITO, as examples.

A pixel defining film 19 may be formed on the passivation film 18 so as to cover edges of the first electrode 100. A portion of the pixel defining film 19 may be removed, such that a central portion of the first electrode 100, excluding the edges of the first electrode 100, is exposed.

The hole transport region 300 may be disposed on the first electrode 100 and the pixel defining film 19. The hole transport region 300 may include a hole injection layer 310 and a hole transport layer 320. As examples, the hole transport region 300 may be a single-layer of a single material, or a single-layer of a plurality of materials different form each other, or may have a multi-layer structure having a plurality of layers of a plurality of materials different from each other. The hole transport region 300 may have, for example, a single-layer structure in which a plurality of different materials are included, or a multi-layer structure having any of the following structures: hole injection layer/ hole transport layer, hole injection layer/hole transport layer/ buffer layer, hole injection layer/buffer layer, hole transport layer/buffer layer, and hole injection layer/hole transport layer/electron blocking layer in which the respective layers are sequentially stacked form the first electrode 100.

The hole transport region 300 may be formed by using a suitable method such as vacuum deposition, spin coating, casting, a Langmuir-Blodgett method, an inkjet printing method, a laser printing method, or a laser induced thermal imaging (LITI) method.

When the hole transport region 300 includes the hole injection layer 310, the hole transport region 300 may include, as examples, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS).

When the hole transport region 300 includes hole transport layer 320, the hole transport region 300 may include, for example, a carbazole derivative such as N-phenyl carbazole. polyvinyl carbazole; a fluorine derivative; a triphenylamine derivative such as N,N'-bis(3-methylphenyl)-N,N'-diphenyl-[1,1-biphenyl]-4,4'-diamine (TPD), 4,4',4"-tris(N-carbazolyl)triphenylamine (TCTA); N,N'-di(1-naphthyl)-N,N-diphenylbenzidine (NPB), 4.4'-cyclohexylidene bis[N,N-bis (4-methylphenyl)benzenamine] (TAPC).

The thickness of the hole transport region 300 may range from about 100 Å to about 10,000 Å, or, for example, from about 100 Å to about 1,000 Å. When the hole transport region 300 includes both a hole injection layer 310 and a hole transport layer 320, the thickness of the hole injection layer 310 may range from about 100 Å to about 10,000 Å, or, for example, from about 100 Å to about 1,000 Å, and the thickness of the hole transport layer 320 may range from about 50 Å to about 2,000 Å, or, for example, from about 100 Å to about 1,500 Å. When the thicknesses of the hole transport layer 300, the hole injection layer 310, and hole transport layer 320 satisfy the above mentioned ranges, a satisfactory hole transport property may be obtained without a substantial rise in driving voltage.

The hole transport region 300 may further include a charge generating material so as to improve the conductivity thereof in addition to above-mentioned material(s). The charge generating material may be uniformly or non-uniformly dispersed in the hole transport region 300. The charge generating material may be, for example, a p-dopant material. The p-dopant material may be, for example, a quinine derivative, a metal oxide, ora cyano group-containing compound. For example, the p-dopant material maybe a quinone derivative such as tetracyanoquinodimethane (TCNQ) or 2,3,5,6-tetrafluoro-tetracyanoquinodimethane (F4-TCNQ),or a metal oxide such as tungsten oxide or molybdenum oxide.

The hole transport region 300 may further include at least one of a buffer layer and an electron blocking layer in addition to the hole injection layer 310 and the hole transport layer 320. The buffer layer may help to increase light emitting efficiency by compensating for a resonance distance according to a wavelength of light emitted from the emission layer 200. A material included in the hole transport region 300 may also be used as a material included in the buffer layer. The electron blocking layer may bea layer that helps to prevent an electron from being injected from the electron transport region 400 into the hole transport region 300.

The emission layer 200 may be disposed on the hole transport region 300. The emission layer 200 may be a single-layer of a single material, or a single-layer of a plurality of materials different form each other, or may have a multi-layer structure having a plurality of layers of a plurality of materials different from each other.

The emission layer 200 may be formed by using a suitable method such as vacuum deposition, spin coating, casting, a Langmuir-Blodgett method, an inkjet printing method, a laser printing method, or a laser induced thermal imaging (LITI) method.

The emission layer 200 may be formed of a suitable material, such as, for example, a material that emits red, green, and/or blue light. The emission layer 200 may include a fluorescent material or a phosphorescent material. In some implementations, the emission layer 200 may include a host material and a dopant material.

The host material may be a suitable material such as, for example, Alq3(tris(8-hydroxyquinolino)aluminum), CBP (4,4'-bis(N-carbazolyl)-1,1'-biphenyl), PVK (poly(n-vinylcarbazole)), AND (9,10-di(naphthalene-2-yl)anthracene), TCTA (4,4',4"-tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2'-dimethyl-biphenyl), MADN (2-methyl-9,10-bis(naphthalen-2-yl)anthracene), or the like.

To provide the emission layer 200 to emit red light, the emission layer 200 may include, for example, a fluorescent material including PBD:Eu(DBM)$_3$(Phen) (tris(dibenzoylmethanato)phenanthoroline europium) or perylene. The dopant material included in the emission layer 200 may be selected from a metal complex or an organometallic complex such as acac(bis(1-phenylisoquinoline) acetylacetonate iridium (PIQIr), acac(bis(1-phenylquinoline)acetylacetonate iridium (PQIr), tris(1-phenylquinoline)iridium (PQIr), and octaethylporphyrin platinum (PtOEP).

To provide the emission layer 200 to emit green light, the emission layer 200 may include, for example, a fluorescent material including tris(8-hydroxyquinolino) aluminum (Alq3). The dopant material included in the emission layer 200 may be selected from a metal complex or an organometallic complex such as Ir(ppy)$_3$(fac-tris(2-phenylpyridine)iridium).

To provide the emission layer 200 emit blue light, the emission layer 200 may include, for example, a fluorescent material including any one selected from a group of spiro-DPVBi, spiro-6P, distyryl-benzene (DSB), distyryl-arylene (DSA), a polyfluorene (PFO) polymer, and a poly(p-phenylene vinylene (PPV) polymer. The dopant material included in the emission layer 200 may be selected from a metal complex or an organometallic complex such as (4,6-F$_2$ppy)$_2$Irpic.

The electron transport region 400 may be disposed on the emission layer 200. The electron transport region 400 may include, for example, at least one of a hole blocking layer 410, an electron transport layer 420, and an electron injection layer 430. For example, the electron transport region 400 may have any of the following structures: electron transport layer/electron injection layer and hole blocking layer/electron transport layer/electron injection layer in which the respective layers are sequentially stacked from the emission layer 200, or a single-layer structure in which two or more layers of the above layers are mixed.

The electron transport region 400 may be formed by using a suitable method such as vacuum deposition, spin coating, casting, a Langmuir-Blodgett method, an inkjet printing method, a laser printing method, or a laser induced thermal imaging (LITI) method.

When the electron transport region 400 includes the electron transport layer 420, the electron transport region 400 may include, for example, tris(8-hydroxyquinolinato) aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq). berylliumbis(benzoquinolin-10-olate) (Bebq2), 9,10-di(naphthalene-2-yl)anthracene (ADN) or a mixture thereof. The thickness of the electron transport layer 420 may range from about 100 Å to about 1,000 Å, or, for example, from about 150 Å to about 500 Å. When the thickness of the electron transport layer 420 satisfies the above mentioned range, a satisfactory electron transport property may be obtained without a substantial rise in a driving voltage.

When the electron transport region 400 includes the electron injection layer 430, the electron transport region 400 may include, for example, a lanthanide metal such as LiF, lithium quinolate (LiQ), Li$_2$O, BaO, NaCl, CsF, Yb, or a metal halide such as RbCl, RbI. The electron injection layer 430 may be also formed of a material mixed with an electron transport material and an insulating organo metal salt. The organo metal salt may be a material having an energy band gap of about 4 eV or higher. For example, the organic metal salt may include metal acetate, metal benzoate, metal acetoacetate, metal acetylacetonate, or metal stearate. The thickness of the electron injection layer 430 may range from about 1 Å to about 100 Å, or, for example, from about 3 Å to about 90 Å. When the thickness of the electron injection layer 430 satisfies the above mentioned range, a satisfactory electron injection property may be obtained without a substantial rise in a driving voltage.

The electron transport region 400 may include a hole blocking layer 410. The hole blocking layer 410 may include, for example, at least one of 2,9-dimethyl-4,7-diphenyl-1,10-phenanthroline (BCP) and 4,7-diphenyl-1,10-phenanthroline (Bphen). The thickness of the hole blocking layer may range from about 20 Å to about 1,000 Å, for example, from about 30 Å to about 300 Å. When the thickness of the hole blocking layer 410 satisfies the above mentioned range, a satisfactory electron blocking property may be obtained without a substantial rise in a driving voltage.

The second electrode 500 may be disposed on the electron transport region 400. The second electrode 500 may be a common electrode, for example, a cathode. The second electrode 500 may be a transmissive electrode, a semi-transmissive electrode, or a reflective electrode. When the second electrode 500 is a transmissive electrode, the second electrode 500 may include Li, Ca, LiF/Ca, LiF/Al, Al, Mg, BaF, Ba, Ag, or a compound thereof, or a mixture thereof (e.g., a mixture of Ag and Mg). The second electrode 500 may include an auxiliary electrode. The auxiliary electrode may include a film formed by depositing the foregoing material so as to face the emission layer, a transparent metal oxide, such as indium tin oxide (ITO), indium zinc oxide (IZO), zinc oxide (ZnO), indium tin zinc oxide (ITZO), Mo, and Ti on the film.

When the second electrode 500 is a semi-transmissive electrode or a reflective electrode, the second electrode 500 may include Ag, Mg, Al, Pt, Pd, Au, Ni, Nd, Ir, Cr, Li, Ca, LiF/Ca, LiF/Al, Mo, Ti, or a compound thereof, or a mixture thereof (e.g., a mixture of Ag and Mg). In some implementations, the second electrode 500 may have a multi-layer structure including a reflective film or semi-transmissive film formed of the materials, and a transparent conductive film formed of indium tin oxide (ITO), indium zinc oxide (IZO), zinc oxide (ZnO), indium tin zinc oxide (ITZO), or the like.

The encapsulation layer 700 may be disposed on the second electrode 500. The encapsulation layer 700 may seal the first electrode 100, the hole transport region 300, the emission layer 200, the electron transport region 400, and the second electrode 500 which are disposed between the encapsulation layer 700 and the substrate SB from an outside. The encapsulation layer 700 may help to prevent oxygen and moisture from penetrating from the outside.

In an embodiment, an unevenness may be formed on each of surfaces of layers disposed on the first electrode 100, for example, on the hole transport region 300, the emission layer 200, the electron transport region 400, the second electrode 500, and the encapsulation layer 700.

When the organic light emitting display apparatus 1000 is a top emission type organic light emitting display apparatus, the first electrode 100 may be a reflective electrode, and the second electrode 500 may be a transmissive electrode or a semi-transmissive electrode. When the organic light emitting display apparatus is a bottom emission type organic light emitting display apparatus, the first electrode 100 may be a transmissive electrode or a semi-transmissive electrode and the second electrode 500 may be a reflective electrode.

The above example embodiment has described that the hole transport region 300 is disposed between the first electrode 100 and the emission layer 200 and the electron transport region 400 is disposed between the second electrode 500 and the emission layer 200. In other implementations, the electron transport region 400 may be disposed between the first electrode 100 and the emission layer 200, and the hole transport region 300 may be disposed between the first electrode 100 and the emission layer 200.

Figure 3:
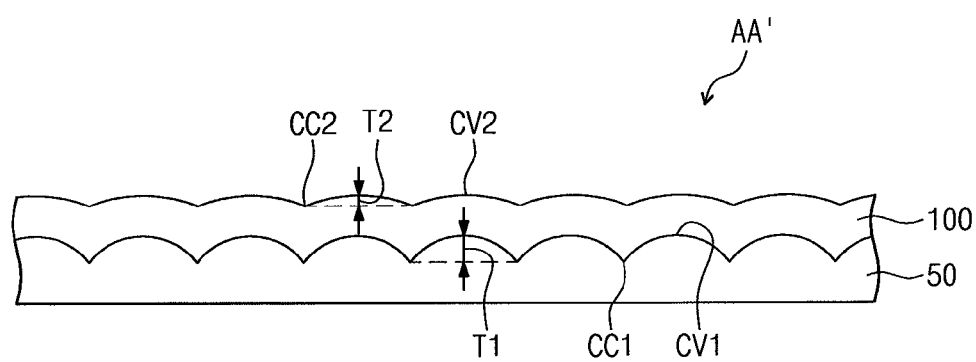
FIG. 3 illustrates a cross-sectional view of enlarged portion AA' of FIG. 2.

FIG. 3 illustrates a cross-sectional view of enlarged portion AA' of FIG. 2. Hereinafter, the organic layer 50 and the first electrode 100 will be described with reference to the drawings.

Referring to FIGS. 2 and 3, the first concave portion CC1 and the first convex portion CV1 may be formed on a surface of the organic layer 50. The first concave portion CC1 may be a portion in which a material included in the organic layer 50 is relatively less deposited, and may be a thinnest portion in the organic layer 50. The first convex portion CV1 may be a portion in which more of a material included in the organic layer 50 is deposited, compared to the first concave portion CC1, and may be a thickest portion in the organic layer 50. The first concave portion CC1 and convex portion CV1 may be spaced apart from each other by a first distance T1 in a vertical direction. As used herein, terms such as "vertical distance between a concave portion and a convex portion" may a vertical distance or height as measured from the low point of the concave portion and the high point of the convex portion.

A second concave portion CC2 and a second convex portion CV2 may be formed on a surface of the first electrode 100. The second concave portion CC2 may be formed in a position corresponding to the first concave portion CC1, and the second convex portion CV2 may be formed in a position corresponding to the first convex portion CV1. However, in some implementations, the positions of the second concave portion CC2 and the second convex portion CV2 may be changed in a process of forming the first electrode 100.

The first electrode 100 may be formed by depositing the materials constituting the first electrode 100 onto the organic layer 50 having the first concave portion CC1 and the first convex portion CV1. The materials constituting the first electrode 100 may agglomerate together, and may accumulate more on the first concave portion CC1 than on the first convex portion CV1. Thus, the second distance T2 in which the second concave portion CC2 and the second convex portion CV2 are spaced apart from each other in a vertical direction may be less than the first distance T1.

When the second electrode 500, the emission layer 200, the hole transport region 300, the electron transport region 400, and the encapsulation layer 700 are formed on the first electrode 100 having the second concave portion CC2 and the second convex portion CV2, a concave portion and a convex portion may be formed on a surface each of the second electrode 500, the emission layer 200, the hole transport region 300, the electron transport region 400, and the encapsulation layer 700 along the unevenness of the first electrode 100. In the layers formed on the first electrode 100, a vertical distance between the concave portion and the convex portion may be same as the second distance T2. In some implementations, in the layers formed on the first electrode 100, a vertical distance between the concave portion and the convex portion may be less than the second distance T2, according to the thickness of each of layers and a material included in each of layers.

In a related art, when a metal particle is deposited on an even organic layer, a difference in distance in the vertical direction between a portion in which agglomeration of the metal particles is great and a portion in which agglomeration of the metal particles is not as great may be large. Regarding a metal layer formed on an organic layer, as a deviation in thickness of the metal layer formed on the organic layer increases, a change rate of light transmittance of the metal layer may increase and, as a result, characteristics of the organic light emitting display apparatus may be degraded.

According to an embodiment, as the first electrode 100 is formed on the organic layer 50 having the first concave portion CC1 and the first convex portion CV1, surface evenness of the first electrode 100 may be improved. As a thickness deviation between a portion in which agglomeration of the materials constituting the first electrode 100 is great and a portion in which the agglomeration of the materials is not as great decreases, surface evenness of the first electrode 100 may be improved. As a result, a change rate of light transmittance in each of portions of the first electrode 100 may be reduced, and light transmittance of the first electrode 100 may be maintained more constant, such that characteristics of the organic light emitting display apparatus may be improved.

When the material included in the first electrode 100 is evenly deposited on the organic layer 50 to a predetermined degree, a thickness deviation that may occur in a deposition process may be minimized. As a result, the first electrode 100 may be thinly formed to improve the light transmittance of the first electrode 100. The first electrode 100 may be formed to be thinner than the second electrode 500.

Hereinafter, effects of the disclosure will be described with reference to drawings.

Figure 4:
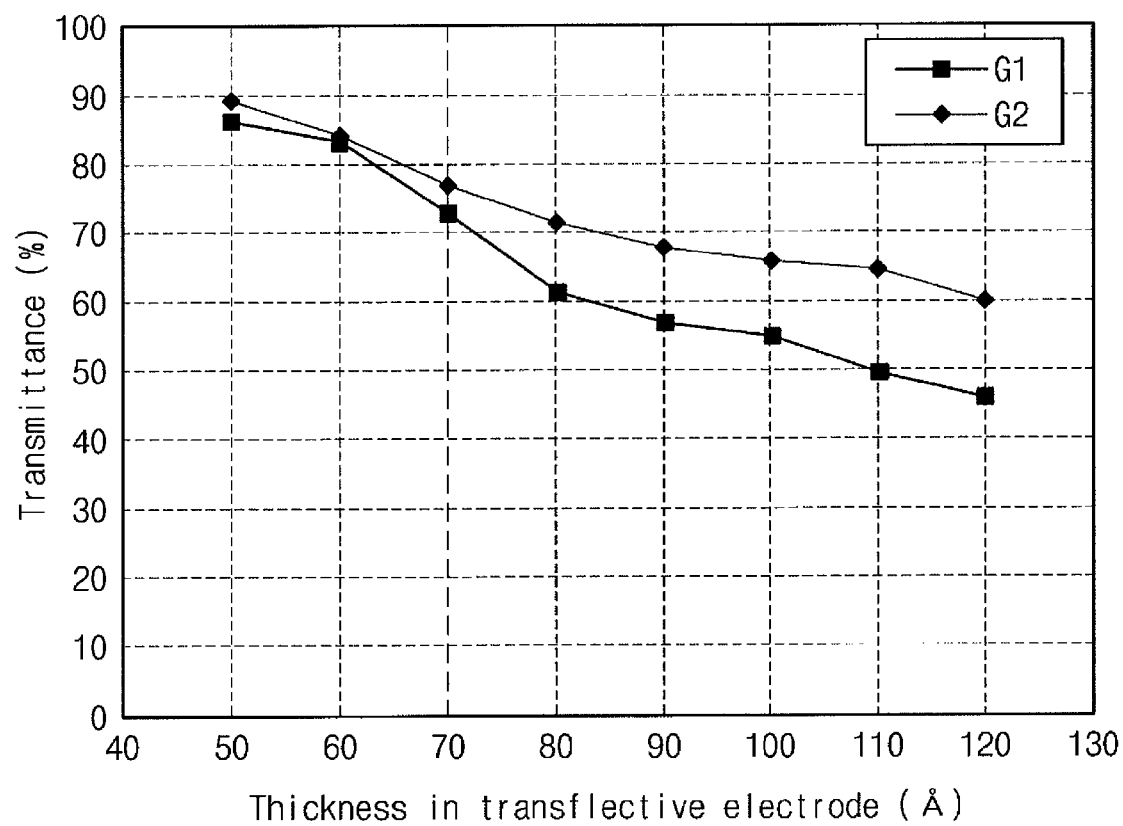
FIG. 4 illustrates a graph comparing light transmittance of a first electrode by a surface property of an organic layer according to the thickness of a first electrode.

FIG. 4 illustrates a graph comparing light transmittance of an electrode layer by a surface property of an organic layer according to changes in thickness of an electrode layer.

In FIG. 4, the first graph line G1 relates to the light transmittance of a first electrode layer formed on an even first organic layer, and the second graph line G2 relates to the light transmittance of a second electrode layer formed on an uneven second organic layer. Herein, the surface of the first organic layer does not have unevenness, and the surface of the second organic layer has unevenness formed at an interval of about 100 nm to about 2.0 μm. The first and second electrode layers are semi-transflective electrodes.

As shown in the first graph line G1, when the thickness of the first electrode layer increases from about 50 Å to about 120 Å, light transmittance of the first electrode layer decreases from about 87% to about 45%.

As shown in the second graph line G2, when the thickness of the second electrode layer increases from about 50 Å to about 120 Å, light transmittance of the second electrode layer decreases from about 90% to about 60%.

As can be seen in comparing the second graph line G2 with the first graph line G1, the second electrode layer is shown to have higher light transmittance than the first electrode layer. In addition, a variation in light transmittance distribution according to the change in the thickness of the second metal layer is less than that of the first metal layer.

Herein, it may be confirmed that as the thickness of first and second electrode layers increases, a degree of roughness of the surface of the second electrode layer is decreases less than the degree of roughness of the first electrode layer.

Without being bound to any particular theory, it is believed that when the first electrode layer is formed on the even organic layer, a vertical distance between the portion in which agglomeration of the materials constituting the first electrode layer is great and the portion in which the agglomeration is not as great increases. In this state, as more of the material included in the first electrode layer is deposited, a thickness deviation of the first electrode layer may increase. Accordingly, the light transmittance efficiency of the first electrode layer may be further lowered.

However, when the second electrode layer is formed on the uneven organic layer, a vertical distance between the portion in which agglomeration of the materials constituting the second electrode layer is great and the portion in which the agglomerate is not as great decreases. In this state, even when more of the material included in the second electrode layer is deposited, a thickness deviation of the second electrode layer may remain constant or may decrease. Accordingly, the light transmittance efficiency of the second electrode layer may be further improved, compared with the light transmittance efficiency of the first electrode layer.

Figure 5:
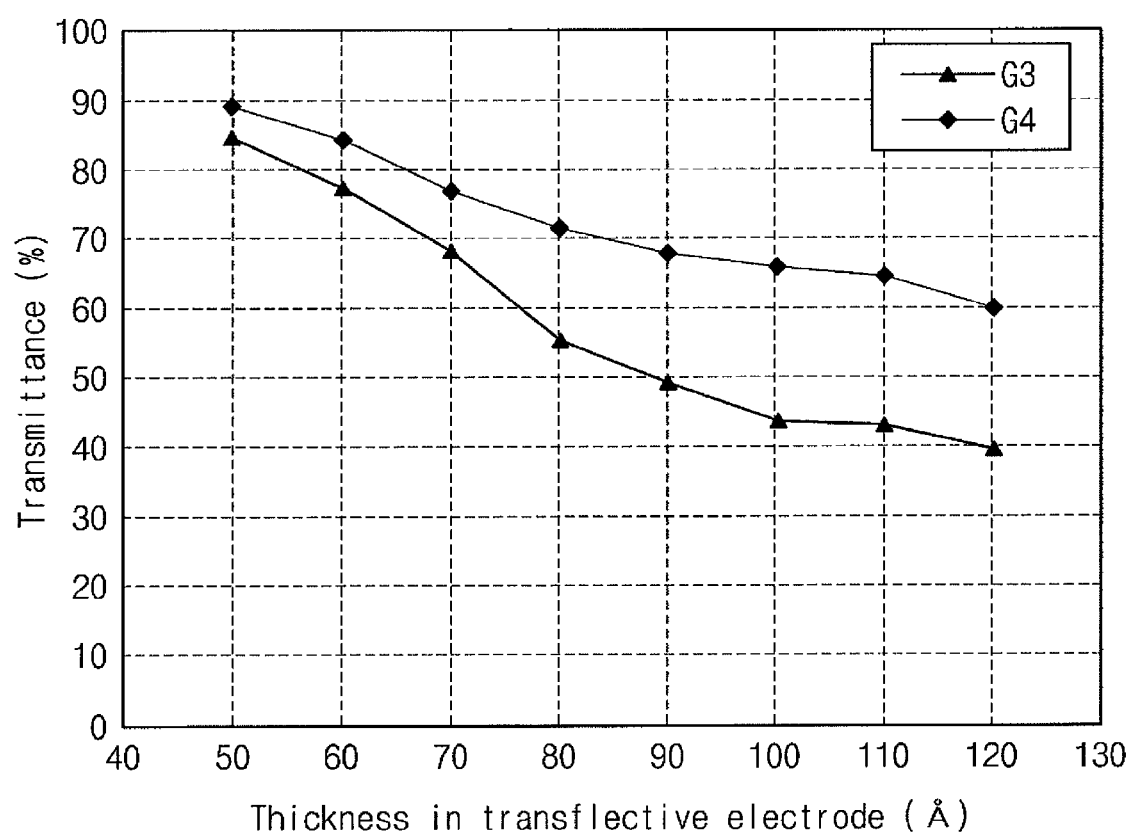
FIG. 5 illustrates a graph comparing light transmittance of a first electrode by a material property of an organic layer according to the thickness of a first electrode.

FIG. 5 illustrates a graph comparing light transmittance of the electrode layer by a material property of an organic layer according to a change in thickness of an electrode layer.

In FIG. 5, the third graph line G3 relates to light transmittance of a first electrode layer formed on an inorganic layer including an inorganic material, and the fourth graph line G4 relates to light transmittance of a second electrode layer formed on an organic layer including an organic material. Herein, the surface of the inorganic layer has unevenness formed at an interval of about 3 μm, and the surface of the organic layer has unevenness formed at an interval of about 1 μm to about 2.5 μm. The first and second electrode layers are semi-transflective electrodes.

In the third graph line G3, as the thickness of the first electrode layer increases from about 50 Å to about 120 Å, light transmittance of the first electrode layer decreases from about 85% to about 40%.

In the fourth graph line G4, as the thickness of the second electrode layer increases from about 50 Å to about 120 Å, light transmittance of the second electrode layer decreases from about 89% to about 60%.

As can be seen by comparing the fourth graph line G4 with the third graph line G3, the second electrode layer is shown to have a higher light transmittance than the first electrode layer. In addition, the distribution of the light transmittance change according to a change in the thickness of the second electrode layer is less than that of the first electrode layer.

Herein, it may be confirmed that as the thickness of the first and second electrode layers increases, a degree of roughness of the surface of the second electrode layer decreases less than the degree of roughness of the first electrode layer as the first and second electrode layers are getting thicker.

Therefore, it may be concluded that when the second electrode layer is formed on the organic layer to include an organic material, the light transmittance efficiency of the second electrode layer may be further enhanced compared to the light transmittance efficiency the first electrode layer.

Hereinafter, a method of manufacturing an organic light emitting display apparatus according to an embodiment will be described with reference to the accompanying drawings.

Figure 6:
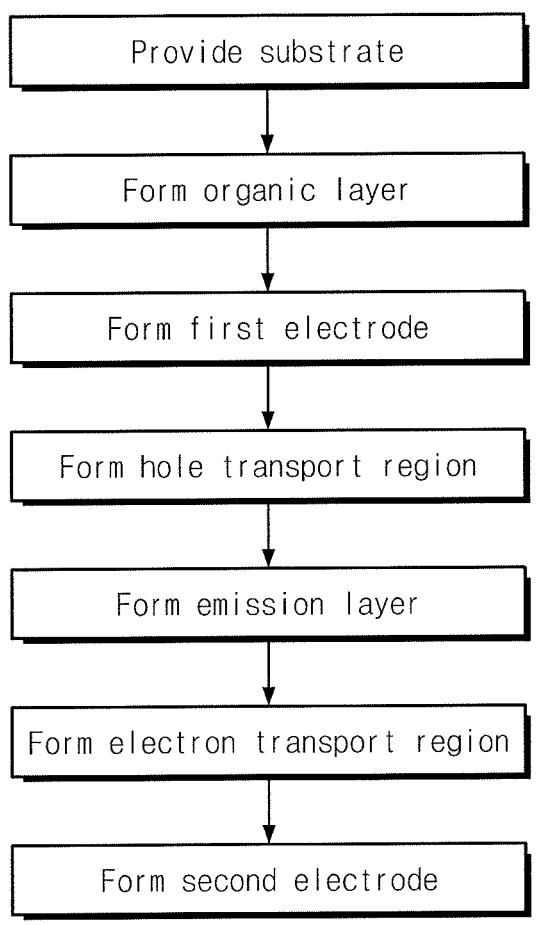
FIG. 6 illustrates a sequence diagram of a manufacturing method of an organic light emitting display apparatus according to an embodiment.

FIG. 6 illustrates a sequence diagram of a manufacturing method of an organic light emitting display apparatus according to an embodiment.

Referring to FIGS. 1 to 6, a method of manufacturing an organic light emitting display apparatus 1000 includes providing a substrate, forming an organic layer having a concave portion and a convex portion on a surface of the substrate (for example, as scattering layer), forming a first electrode having a second concave portion and a second convex portion on a surface of the organic layer, forming a hole transport region on the first electrode, forming an emission layer on the hole transport region, forming an electron transport region on the emission layer, and forming a second electrode on the electron transport region.

Forming the hole transport region may include forming a hole injection layer on the first electrode and forming a hole transport layer on the hole injection layer.

Forming the electron transport region may include at least two of forming a hole blocking layer on the emission layer, forming an electron transport layer on the hole blocking layer, and forming an injection layer on the electron transport layer.

The manufacturing method may further include forming an encapsulation layer on the electron transport layer.

The substrate SB may be transparent insulating substrate. A driver layer 10 is formed on the substrate SB. Forming the remaining layers may be performed on the substrate SB through a deposition process.

The organic layer 50 may be formed on the driver layer 10. Forming the organic layer 50 may be performed by a thermal deposition process or an electron beam deposition process. When the organic layer 50 is formed through a thermal deposition process, a deposition target compound may be filled in a deposition source and the deposition source may be heated. The deposition target compound may be vaporized to be deposited onto the substrate SB.

The deposition target compound may include at least one base material selected from the group of benzene, naphthalene, anthracene, tetracene, pentacene, amine, benzidine, biphenyl, carbazole, pyridine, pyridine, bipyridine, imidazole, phenanthroline, phenylborane, pyrimidine, and triazine. The base material may be substituted by at least one substituent selected from the group of a benzoyl group, a carboxyl group, an aminophenoxyl group, a tricarbonate group, or a styryl group.

The base material may include a plurality of substitution sites substituted by the substituents. A plurality of substituents may be substituted on the plurality of substitution sites of the base material.

When the molecular structure of the base material has an even shape or a shape equivalent to the even shape, the base material may have a structure in which one layer may be easily stacked on another layer. In addition, when the molecular structure of the substituent has a curved shape, the substituent may have a structure to easily agglomerate together.

The thermal deposition process may be performed at about 100° C. to about 600° C.

The deposited target compound may be heated in a deposition process to agglomerate together, such that unevenness having a concave portion and a convex portion may be formed on a surface the formed layer. When the temperature of the thermal deposition process is lower than about 100° C., the deposition target compound may be difficult to vaporize. When the temperature of the thermal deposition process is higher than about 600° C., the substrate SB may deteriorate.

The first electrode 100 may be formed on the organic layer 50. As the materials that constitute the first electrode 100, for example, metal particles of Ag, Mg, Al, Pt, Pd, Au, Ni, Nd, Ir, Cr, or a mixture thereof, are deposited on the organic layer 50 to agglomerate together, a surface roughness of the first electrode 100 may be decreased. In some implementations, when a transparent metal oxide, for example, indium tin oxide (ITO), indium zinc oxide (IZO), zinc oxide (ZnO), or indium tin zinc oxide (ITZO) is formed on the organic layer 50 to constitute the first electrode, a surface roughness of the first electrode 100 may be decreased.

A concave portion and a convex portion may be formed on a surface of the first electrode 100. The material included in the first electrode 100 may agglomerate together more on the concave portion of the organic layer than on the convex portion. The distance in a vertical direction between the concave portion and the convex portion of the first electrode 100 is less than that of the organic layer 50.

According to a method of manufacturing an organic light emitting display apparatus according to an embodiment, the organic layer 50 may be formed through a thermal deposition process and/or through an electron beam deposition process. The organic layer 50 having an unevenness may be formed without requiring an additional photo process. For example, the organic layer 50 may be formed through a deposition process (for example, a thermal evaporation process) that may be the same as a deposition process of forming the first electrode 100, the hole transport region 300, the emission layer 200, the electron transport region 400, the second electrode 500, and the encapsulation layer 700. As a result, manufacturing time and cost of the organic light emitting display apparatus may be reduced.

Further, according to a method of manufacturing an organic light emitting display apparatus according to an embodiment, when the metal particles of the first electrode 100 are deposited on the organic layer 50 having the unevenness, the surface of the first electrode 100 may be made flatter to a predetermined degree. Accordingly, a thickness deviation of the first electrode 100 may be reduced to thus improve the light transmittance of the first electrode 100.

By way of summation and review, when light emitted from the organic emission layer of an organic light emitting display apparatus is reflected from an interface between adjacent layers, a resonance phenomenon may occur. which may lead to color shift according to a viewing angle.

According to an organic light emitting display apparatus according to embodiments, when an electrode layer is formed on an organic layer having an uneven surface, the electrode layer may be formed flat. Accordingly, the electrode layer may improve the light transmittance and minimize a change of transmittance that may occur in a process, due to a deviation in thickness of the electrode layer.

According to embodiments, an organic light emitting display apparatus having improved light transmittance efficiency, an organic light emitting display apparatus capable of minimizing a light transmittance efficiency change caused by thickness distribution in a metal electrode, and a method of manufacturing the same may be provided. The method of manufacturing may effectively form the metal layer.

According to a method of manufacturing an organic light emitting display apparatus according to embodiments, an organic layer and an electrode layer which have a concave portion and a convex portion may be formed without experiencing an additional photo process.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light emitting display apparatus, comprising:
   a substrate;
   an organic layer on the substrate, wherein the organic layer includes a first concave portion and a first convex portion on a surface thereof;
   a first electrode on the organic layer, wherein the first electrode includes a second concave portion and a second convex portion on a surface thereof;
   a second electrode on the first electrode; and
   an emission layer between the first and second electrodes,
   wherein a vertical distance between the second concave portion and the second convex portion is less than that between the first concave portion and the first convex portion.

2. The organic light emitting display apparatus as claimed in claim 1, wherein the organic layer includes at least one base material selected from the group of benzene, naphthalene, anthracene, tetracene, pentacene, amine, benzidine, biphenyl, carbazole, pyridine, pyridine, bipyri dine, imidazole, phenanthroline, phenylborane, pyrimidine, and triazine,
   wherein the base material is substituted by at least one substituent selected from the group of a benzoyl group, a carboxyl group. an aminophenoxyl group, a tricarbonate group, and a styryl group.

3. The organic light emitting display apparatus as claimed in claim 2, wherein the base material includes a plurality of substitution sites substituted by the substituent.

4. The organic light emitting display apparatus as claimed in claim 1, further comprising:
   a hole transport region between the first electrode and the emission layer; and
   an electron transport region between the second electrode and the emission layer.

5. The organic light emitting display apparatus as claimed in claim 4, wherein the hole transport region includes:
   a hole injection layer on the first electrode; and
   a hole transport layer on the hole injection layer.

6. The organic light emitting display apparatus as claimed in claim 4, wherein the electron transport region includes at least two selected from the group of a hole blocking layer, an electron transport layer, and an electron injection layer on the emission layer.

7. The organic light emitting display apparatus as claimed in claim 4,
further including an encapsulation layer on the second electrode, the encapsulation layer sealing the organic layer, the first electrode, the hole transport region, the emission layer, the electron transport region, and the second electrode from an outside.

8. The organic light emitting display apparatus as claimed in claim 7, wherein each of the second electrode, the emission layer, the hole transport region, the electron transport region, and the encapsulation layer includes a concave portion and a convex portion on a surface thereof.

9. The organic light emitting display apparatus as claimed in claim 8, wherein a vertical distance between the concave portion and the convex portion of each of the second electrode, the emission layer, the hole transport region, the electron transport region, and the encapsulation layer is the same as or less than that between the second concave portion and the second convex portion.

10. The organic light emitting display apparatus as claimed in claim 1, wherein the first electrode is thinner than the second electrode.

11. A method of manufacturing an organic light emitting display apparatus, the method comprising:
providing a substrate;
forming an organic layer having a first concave portion and a first convex portion on a surface of the substrate;
forming a first electrode having a second concave portion and a second convex portion on a surface of the organic layer;
forming a hole transport region on the first electrode;
forming an emission layer on the hole transport region;
forming an electron transport region on the emission layer; and
forming a second electrode on the electron transport region, wherein, informing the first electrode having the second concave portion and the second convex portion on the surface of the organic layer, a vertical distance between the second concave portion and the second convex portion is formed to be less a vertical distance that between the first concave portion and the first convex portion.

12. The method as claimed in claim 11, wherein the organic layer includes at least one base material selected from the group of benzene, naphthalene, anthracene, tetracene, pentacene, amine, benzidine, biphenyl, carbazole, pyridine, pyridine, bipyridine, imidazole, phenanthroline, phenylborane, pyrimidine, and triazine,
wherein the base material is substituted by at least one substituent selected from the group of a benzoyl group, a carboxyl group, an aminophenoxyl group, a tricarbonate group, and a styryl group.

13. The method as claimed in claim 12, wherein the base material includes a plurality of substitution sites substituted by the substituent.

14. The method as claimed in claim 11, wherein forming the organic layer is performed by a thermal deposition process or an electron beam deposition process.

15. The method as claimed in claim 11, wherein forming the organic layer having the first concave portion and the first convex portion on the surface of the substrate, forming the first electrode having the second concave portion and the second convex portion on the surface of the organic layer, forming the hole transport region on the first electrode, forming the emission layer on the hole transport region, forming the electron transport region on the emission layer, and forming the second electrode on the electron transport region, are performed by a same method of deposition.

16. The method as claimed in claim 11, wherein forming the hole transport region includes:
forming a hole injection layer on the first electrode; and
forming a hole transport layer on the hole injection layer.

17. The method as claimed in claim 11, wherein forming the electron transport region includes at least two selected from the group of:
forming a hole blocking layer on the emission layer;
forming an electron transport layer on the hole blocking layer; and
forming an electron injection layer on the electron transport layer.

18. The method as claimed in claim 11, wherein each of the first and second electrodes, the emission layer, the hole transport region, and the electron transport region is formed to include a concave portion and a convex portion on a surface thereof.

* * * * *